(12) United States Patent
Hashimoto

(10) Patent No.: US 8,480,934 B2
(45) Date of Patent: Jul. 9, 2013

(54) METHOD FOR MANUFACTURING SEMICONDUCTOR DEVICE

(75) Inventor: Koji Hashimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 259 days.

(21) Appl. No.: 12/958,994

(22) Filed: Dec. 2, 2010

(65) Prior Publication Data

US 2011/0129780 A1 Jun. 2, 2011

(30) Foreign Application Priority Data

Dec. 2, 2009 (JP) .................................. 2009-274854

(51) Int. Cl.
*B29C 45/76* (2006.01)
*B28B 3/00* (2006.01)
*H05K 1/00* (2006.01)
*G06F 19/00* (2006.01)
*G06F 17/50* (2006.01)

(52) U.S. Cl.
USPC .......... 264/40.1; 264/104; 264/241; 264/250; 264/255; 264/294; 264/319; 264/330; 264/331.11; 264/494; 264/495; 264/496; 700/110; 716/112; 174/250; 428/36.91; 425/135

(58) Field of Classification Search
USPC ................ 264/40.1, 104, 241, 250, 255, 294, 264/319, 330, 331.11, 494, 495, 496; 700/110; 716/112; 174/250; 428/36.91; 425/135
See application file for complete search history.

(56) References Cited

U.S. PATENT DOCUMENTS

| 7,142,992 | B1 * | 11/2006 | Huet et al. ........................ 702/58 |
| 7,711,514 | B2 * | 5/2010 | Park et al. ....................... 702/123 |
| 7,729,529 | B2 * | 6/2010 | Wu et al. ......................... 382/149 |
| 7,796,804 | B2 * | 9/2010 | Bhaskar et al. ................. 382/145 |
| 2005/0004774 | A1 * | 1/2005 | Volk et al. ...................... 702/108 |
| 2006/0082763 | A1 * | 4/2006 | Teh et al. .......................... 356/72 |
| 2010/0237540 | A1 * | 9/2010 | Inanami et al. ................ 264/293 |
| 2010/0248482 | A1 * | 9/2010 | Hashimoto .................... 438/700 |
| 2012/0045854 | A1 * | 2/2012 | Matsuoka et al. ............... 438/16 |
| 2012/0049396 | A1 * | 3/2012 | Tsutsui et al. ................. 264/40.1 |

FOREIGN PATENT DOCUMENTS

| EP | 1 072 954 A2 | 1/2001 |
| JP | 2000-194142 | 7/2000 |
| JP | 3110159 B2 * | 11/2000 |

* cited by examiner

*Primary Examiner* — Christina Johnson
*Assistant Examiner* — Atul P. Khare
(74) *Attorney, Agent, or Firm* — Finnegan, Henderson, Farabow, Garrett & Dunner, LLP

(57) ABSTRACT

According to one embodiment, a manufacturing method includes performing lithography processes for manufacturing a semiconductor device that includes a three-dimensional stacked device. The stacked device includes layers stacked above a substrate. Each of the layers includes a device circuit. The lithography processes include a lithography process for forming a lower layer of the layers by using a first original plate that has quality not less than a certain level. The first original plate is selected from original plates. Each of the original plates includes a pattern corresponding to the device circuit. The original plates are ranked according to quality based on defect. The lithography processes further include a lithography process for forming a higher layer of the layers by using a second original plate that has quality lower than the certain level. The second original plate is selected from the original plates.

16 Claims, 15 Drawing Sheets

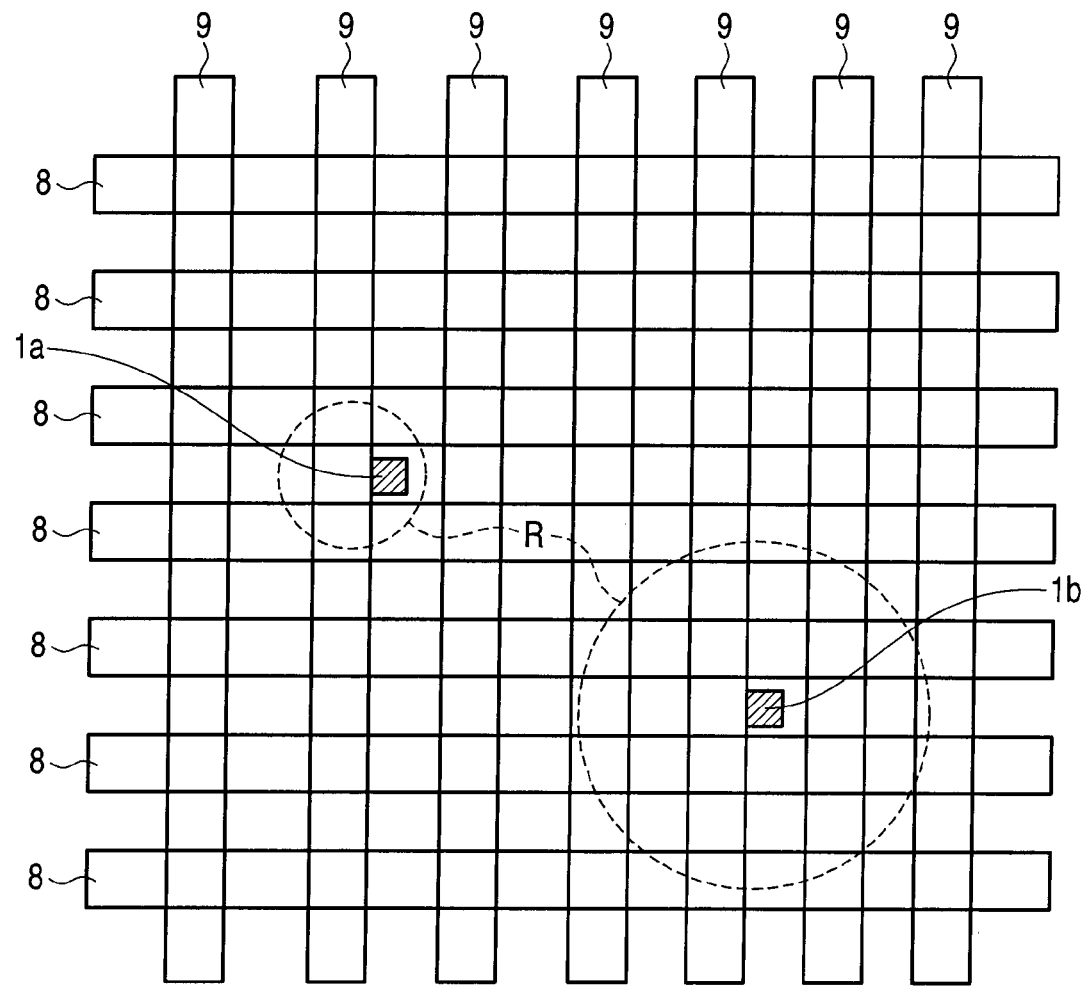
F I G. 2

Unevenness of defects: small
(clustering factor large)
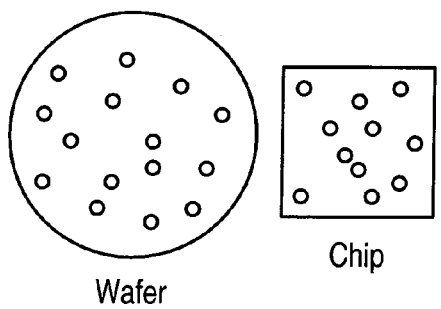
Wafer      Chip
F I G. 5A
Unevenness of defects: large
(clustering factor small)
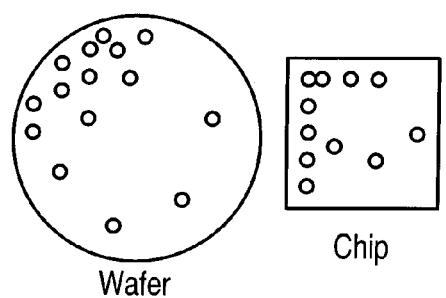
Wafer      Chip
F I G. 5B
$$f(x) = {}_{a+x-1}C_x \cdot \left(\frac{\lambda}{\alpha+\lambda}\right)^x \cdot \left(\frac{\alpha}{\alpha+\lambda}\right)^\alpha$$
$\alpha$ : clustering factor
F I G. 5C Template      Wafer Template      Wafer

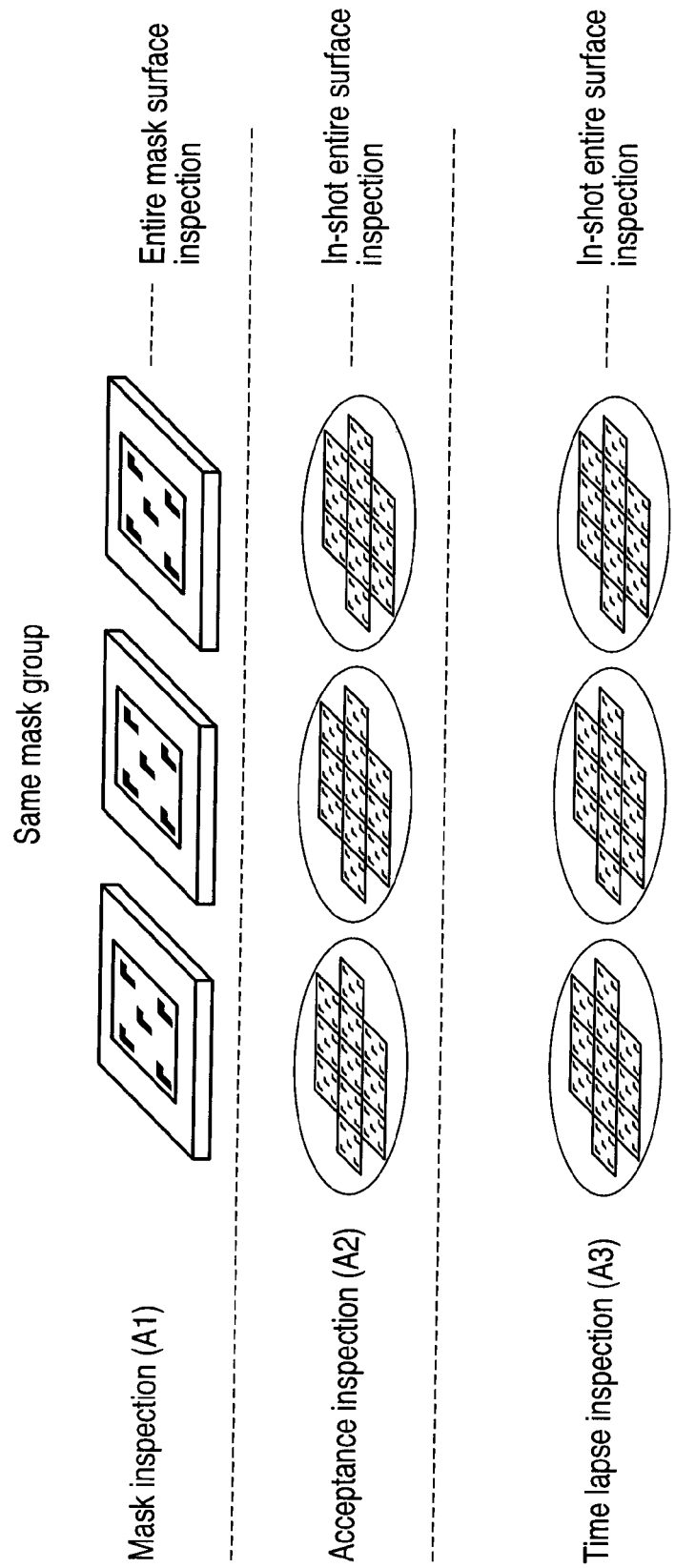
F I G. 7

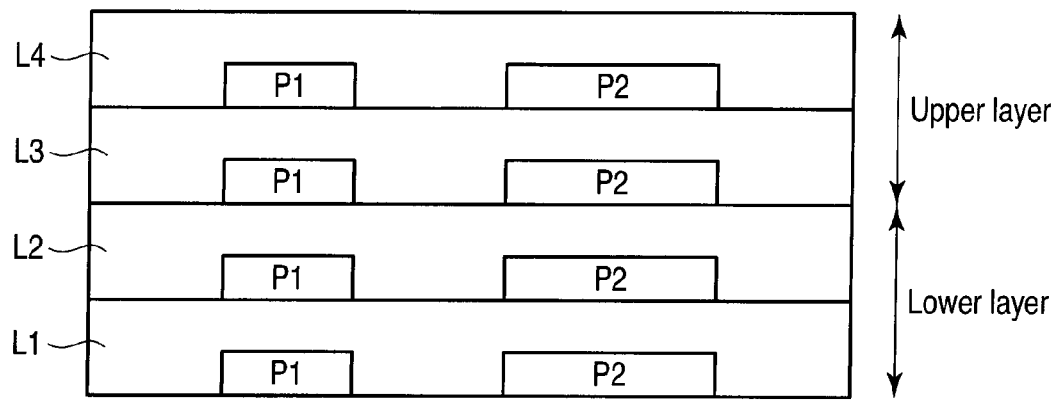
F I G. 8
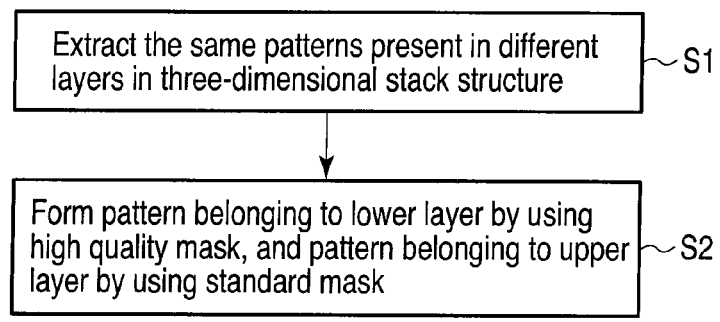
F I G. 9

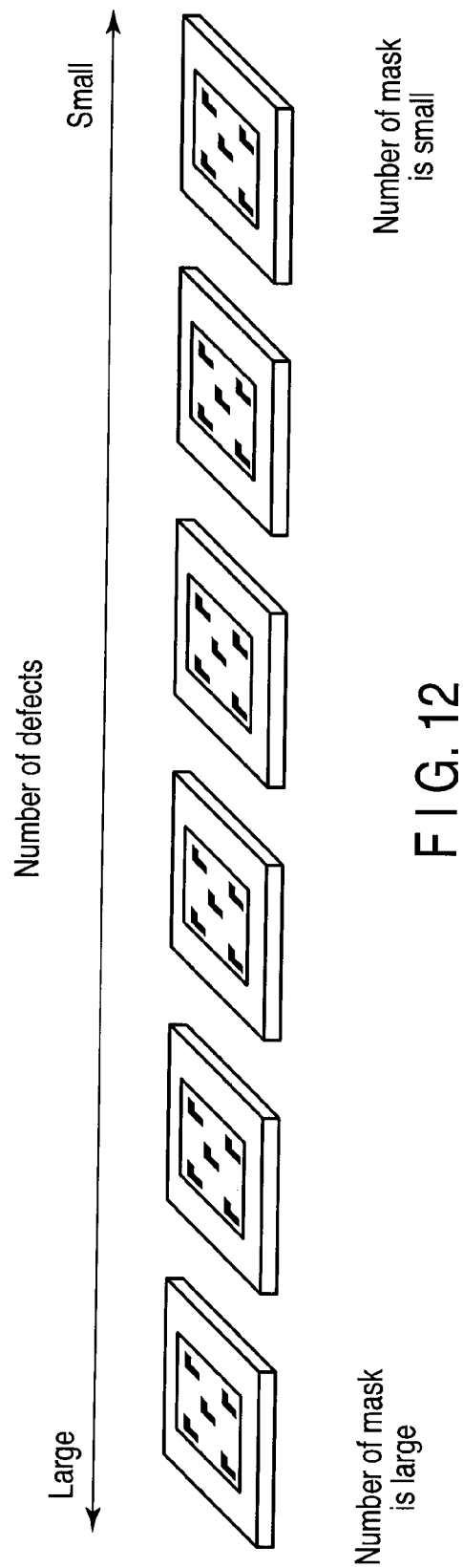
F I G. 12

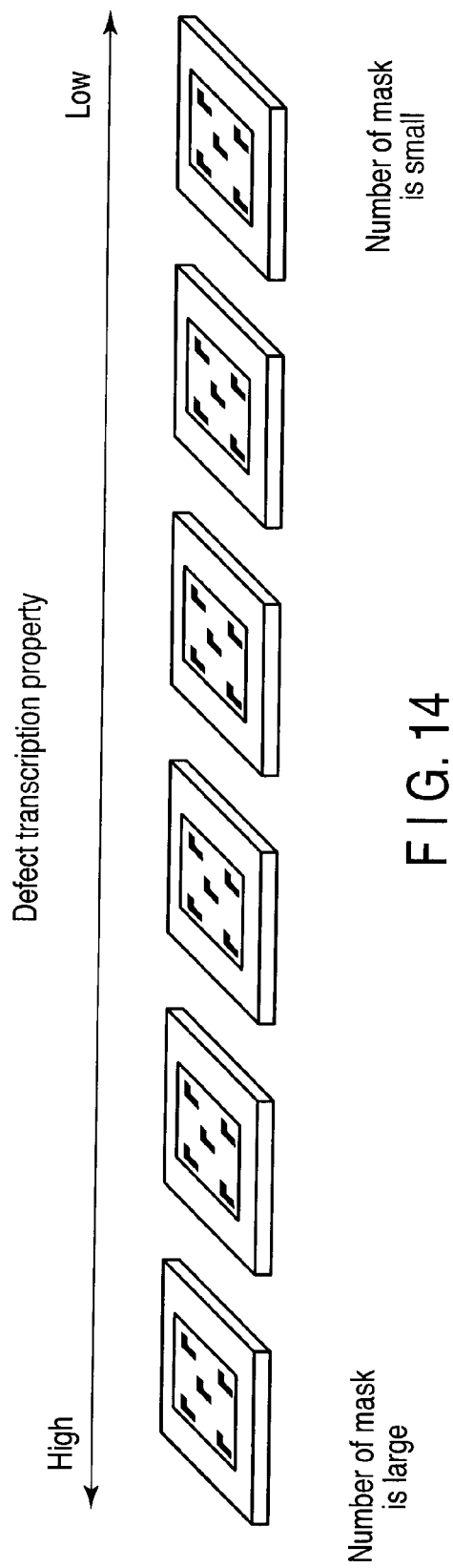
F I G. 14

METHOD FOR MANUFACTURING SEMICONDUCTOR DEVICE

CROSS-REFERENCE TO RELATED APPLICATIONS

This application is based upon and claims the benefit of priority from Japanese Patent Application No. 2009-274854, filed Dec. 2, 2009; the entire contents of which are incorporated herein by reference.

FIELD

Embodiments described herein relate generally to a method for manufacturing a semiconductor device.

BACKGROUND

In recent years, size reduction of information communication devices has been advanced. Accordingly, a one-chip IC has been needed to be mounted on the information communication device, since the one-chip IC realizes higher performance (multifunction), lower power consumption, and larger storage capacity by a single chip.

The improvements of performance and storage capacity of a chip are expected by miniaturization. However, it is necessary to improve the performance and the storage capacity more efficiently in the memory business where cost competition is severe.

Recently, a memory device having a three-dimensional stack structure (three-dimensional stack memory device) is proposed for dramatic improvement of performance and storage capacity of a memory chip. For example, nonvolatile memory devices such as ReRAM (Resistance Random Access Memory), PCRAM (Phase Change Memory), MRAM (Magnetoresistive Random Access Memory), and the like are proposed.

The three-dimensional stack memory device enables the storage capacity to increase without depending on miniaturization of memory cells by increasing number of lamination of the memory cells. The chip size is enlarged by increasing the number of lamination of the memory cells since the device is heightened. In order to satisfy both of the storage capacity and the chip size, the miniaturization of the memory cells becomes necessary after all.

A technique for the miniaturization is called the microfabrication technique. An optical lithography technique is an elemental technology of the microfabrication technique. The optical lithography technique has conquered possible miniaturization limits predicted in the past one after another, and plays the leading role in the semiconductor device manufacturing even now. However, due to the acceleration of miniaturization of a semiconductor device, a pattern pitch smaller than the minimum pattern pitch formable by the optical lithography technique is required to be formed.

Under these circumstances, as one of techniques satisfying both of the fine pattern formation and the mass production, attention is paid to imprint technique, which transfers a pattern of template onto a substrate.

The conventional optical lithography technique and imprint technique have developed by targeting a semiconductor device having a structure in which cells (elements) are arranged two-dimensionally in a plane (two-dimensional arrangement structure) such as a NAND flash memory. These techniques have not developed by targeting a semiconductor device having a device in which the two-dimensional arrangement structures are laminated (three-dimensional stack device) such as a PCRAM or the like.

BRIEF DESCRIPTION OF THE DRAWINGS

FIG. 2 is a plan view schematically showing the upper layer defect and the lower layer defect in the three-dimensional stack device;

FIG. 5A, FIG. 5B, and FIG. 5C are views for explaining the clustering factor;

FIG. 7 is a view schematically showing an inspection flow of a mask;

FIG. 8 is a cross-sectional view schematically showing an example of a three-dimensional stack device;

FIG. 9 is a flowchart showing a manufacturing method of a second embodiment;

FIG. 12 is a view schematically showing a sorting method based on defect number;

FIG. 14 is a view schematically showing a sorting method based on defect transcription property of the mask pattern to the wafer;

DETAILED DESCRIPTION

Embodiments will be described below with reference to the accompanying drawings.

First Embodiment

In general, according to one embodiment, a manufacturing method includes performing lithography processes for manufacturing a semiconductor device that includes a three-dimensional stacked device. The stacked device includes layers stacked above a substrate. Each of the layers includes a device circuit. The lithography processes include a lithography process for forming a lower layer of the layers by using a first original plate that has quality not less than a certain level. The first original plate is selected from original plates. Each of the original plates includes a pattern corresponding to the device circuit. The original plates are ranked according to quality based on defect, quality based on defect transcription property to the substrate, or quality relating to number of used times. The lithography processes further include a lithography process for forming a higher layer of the layers by using a second original plate that has quality lower than the certain level. The second original plate is selected from the original plates.

Second Embodiment

The following problem occurs when an advanced lithography technique as represented by imprint lithography is applied to a three-dimensional stack device such as ReRAM or the like. The three-dimensional stack device comprises layers stacked on a substrate. Each of the layers comprises a device structure including a device circuit.

Figure 1:
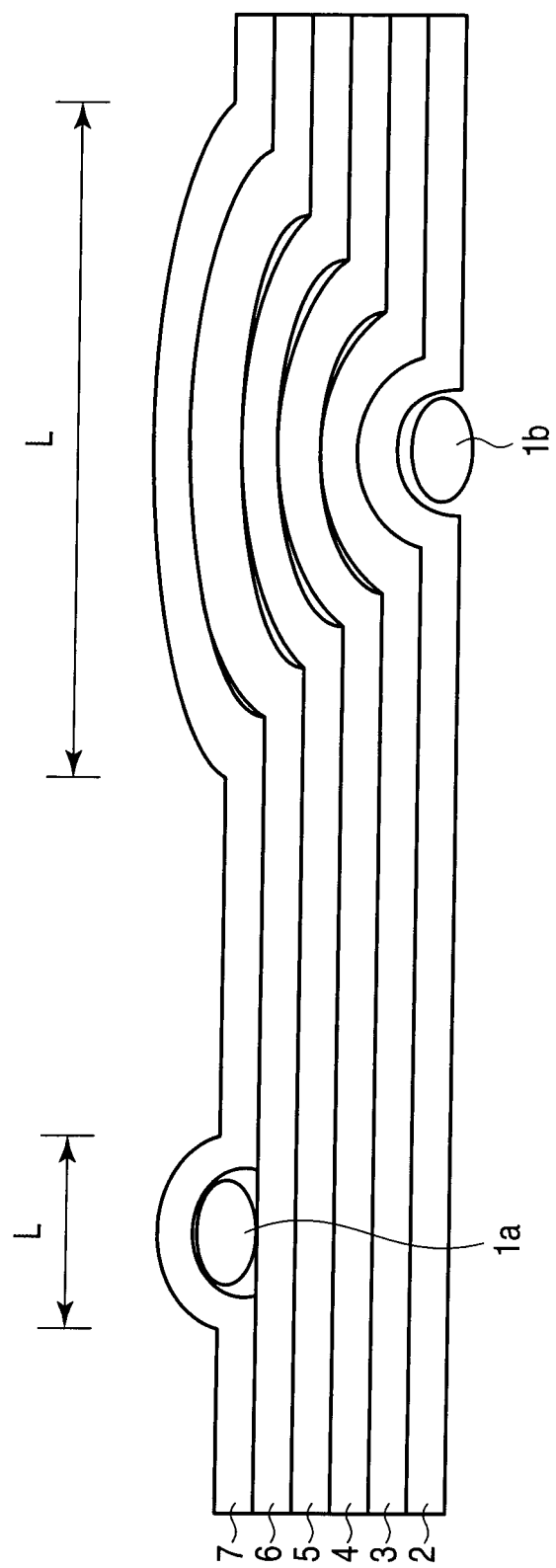
FIG. 1 is a cross-sectional view schematically showing upper layer defect and lower layer defect in a three-dimensional stack device.

FIG. 1 is a cross-sectional view schematically showing a defect occurred in an upper layer and a defect occurred in a lower layer in the three-dimensional stack device. FIG. 2 is a plan view schematically showing the defect occurred in the upper layer and the defect occurred in the lower layer in the three-dimensional stack device. In FIG. 1 and FIG. 2, a reference symbol 1a denotes the defect occurred in the upper layer (upper layer defect), 1b denotes the defect occurred in the lower layer (lower layer defect), 2 to 7 denote layers constituting the three-dimensional stack device and including the device structures, 8 and 9 each denote wiring lines perpendicular to each other (for example, word lines and bit lines), L denotes defect size, and R denotes range under the influence of the defects.

As shown in FIG. 1, the upper layer defect 1a has influence on the layer 7 (uppermost layer), but the upper layer defect 1a does not have influence on the layers 2 to 6. The lower layer defect 1b has influence on the layers 2 to 7. The defect size L of the layer 7 resulting from the lower layer defect 1b is greater than the defect size L of the layer 7 resulting from the upper layer defect 1a. In other words, as shown in FIG. 2, the range R under the influence of the lower defect 1b is wider than the rage R under the influence of the upper layer defect 1a. This is because the defect influence appears in a more amplified state in the higher layer.

Figure 3:
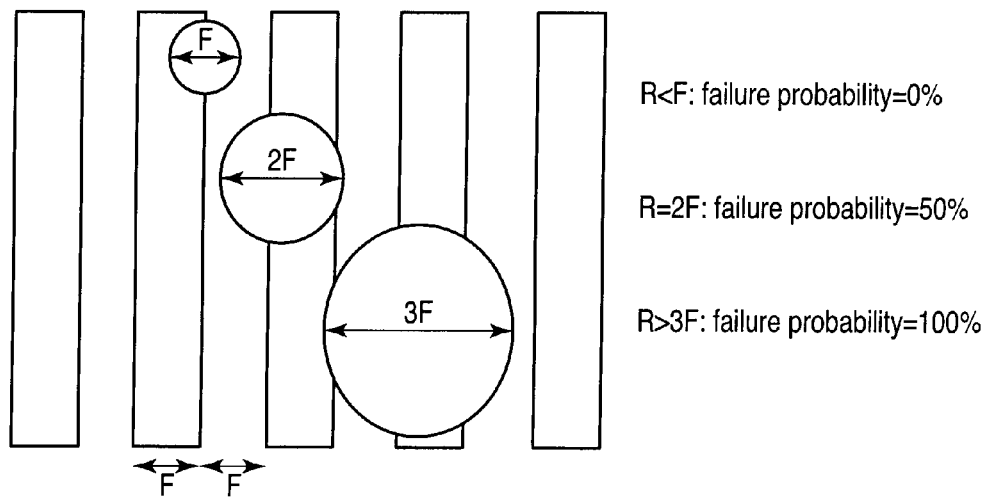
FIG. 3 is a view showing a relationship between defect size and failure probability.

FIG. 3 is a view showing a relationship between the defect size (particle diameter) and failure probability in a case of line-and-space patterns. In FIG. 3, F denotes a half pitch of the line-and-space patterns. As can be seen from FIG. 3, the defects having defect size greater than F affect the yield rate.

As described above, in the three-dimensional stack device, the defect in the layer lying lower level causes the defect having greater defect size in the uppermost layer, and hence the defect in the layer lying lower level has the greater influence on the yield rate.

Figure 4:
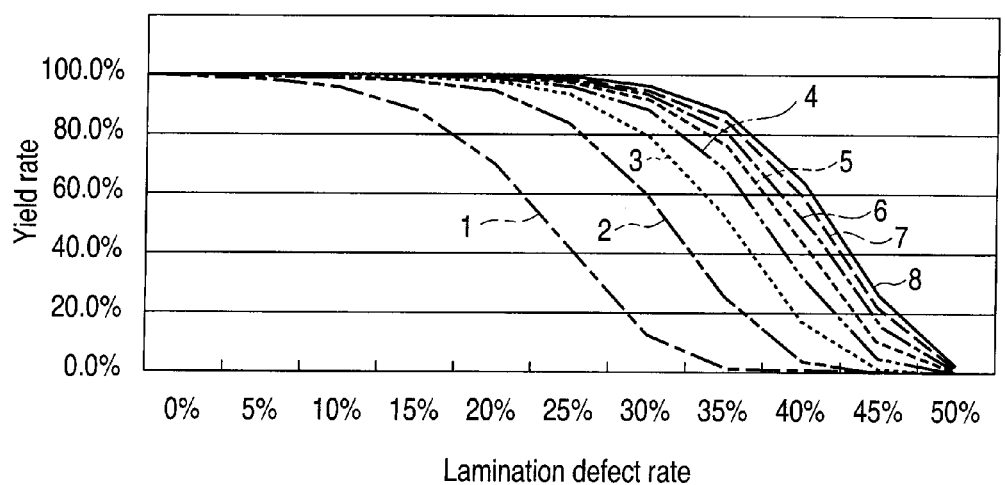
FIG. 4 is a graph showing a relationship between lamination defect rate and yield rate for each of clustering factors 1 to 8 when a redundancy circuit is used.

FIG. 4 is a graph showing a relationship between lamination defect rate (increase rate of lower layer defect to upper layer defect) and yield rate for each of clustering factors 1 to 8 when a redundancy circuit is used.

As shown in FIG. 4, the yield rate changes depending on values of the clustering factors, though the necessary yield rate is secured when the lamination defect rate is less than or equal to about 5 to 10%. However, it can be seen that it is difficult to secure the necessary yield rate even by using a redundancy circuit when the lamination defect rate is higher than or equal to about 30 to 40%.

The defects in the higher and lower layers affect defect size of layers disposed above the higher and lower layers. In light of the above affection, the lamination defect rate in the upper layer part of the ReRAM is, for example, 5 to 10%, and the lamination defect rate in the lower layer part of the ReRAM is, for example, 30 to 40%.

By using FIGS. 5A to 5C, the clustering factor will be described briefly. The clustering factor is a feature quantity representing existence of defects unevenly distributed in space. As shown in FIG. 5A, when the unevenness of the defects is small, the clustering factor is large and, conversely, as shown in FIG. 5B, when the unevenness of the defects is large, the clustering factor is small. As shown in FIG. 5C, the clustering factor is defined by a in negative binomial distribution f(x).

The influence of the lower layer defect described above is liable to become a serious problem in the imprint lithography which is one of the advanced lithography technique. The imprint lithography includes a transfer process of bringing a template into contact with a substrate at the time of forming a pattern. The defect on the template may be transferred onto the substrate together with the pattern of the template. Particularly, the defect previously adhered on the template (adhesion defect) exhibits extremely high transcription property.

Figure 6A:
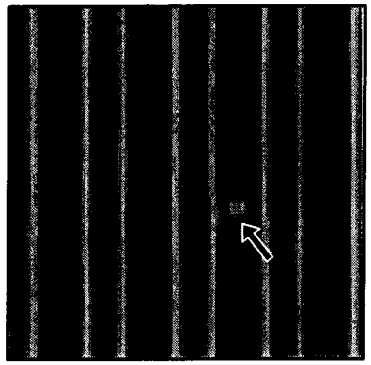
FIG. 6A and FIG. 6B are views showing transfer characteristics in a case of using a template having a opaque defect, and transfer characteristics in a case of using a template having a clear defect.
Figure 6A:
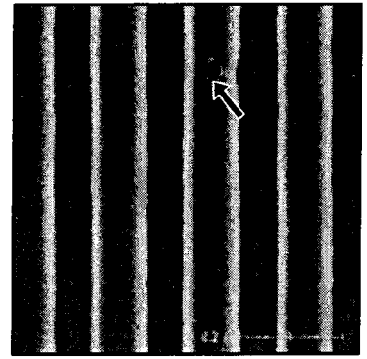
Figure 6B:
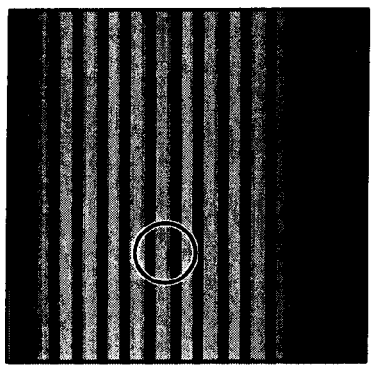
Figure 6B:
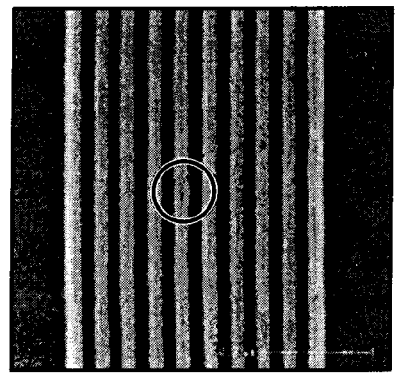

FIG. 6A and FIG. 6B show an example of the above case. FIG. 6A shows transfer characteristics in a case of using a template on which line-and-space patterns (hp: 90 nm) having an opaque defect (size: 40 nm$^2$) is formed, FIG. 6B shows transfer characteristics in a case of using a template on which line-and-space patterns (hp: 24 nm) having a clear defect (size: 40 nm$^2$) is formed. From FIG. 6A and FIG. 6B, it can be seen that the opaque defect (adhesion defect) is higher in transfer characteristics than the clear defect (non-adhesion defect).

When the advanced lithography technique represented by the imprint lithography having high transcription property to a wafer, is applied to the three-dimensional stack device, the defect on the original plate such as a template defect or the like, has not negligible influence on the LSI operation. This closes the future prospect of the advanced lithography technique represented by nanoimprint lithography, and by extension the future prospect of three-dimensional stack device itself. A manufacturing method of a semiconductor device of an embodiment taking the above circumstances into consideration will be described below.

First, an inspection of a mask used as an original plate in the optical lithography (transmission-type mask) will be described below.

FIG. 7 is a view schematically showing an inspection flow of the mask.

The inspection of the mask includes an inspection of the mask (A1), an inspection at the time of acceptance of the mask (A2), and a time lapse inspection of the mask (A3).

The inspection A1 is an inspection carried out at the time of shipment. As an object to be inspected at this time, there is a mask group including a plurality of masks identical with each other in pattern (same mask group). Here, the identical patterns are patterns on the masks corresponding to a device circuit to be formed on the substrate. The inspection A1 is carried out by the mask manufacturer. Further, the inspection A1 is mainly carried out by using a mask defect inspection apparatus, and the entire surface of the mask is inspected.

The defect of the mask to be detected by the inspection A1 is, for example, a defect resulting from mask process for forming the mask (process for forming a pattern on a mask substrate), a defect resulting from mask material (material constituting a member of the mask such as a mask substrate or the like), or a defect resulting from cleaning process (cleaning of the mask obtained through the mask process).

When the defects detected by the inspection A1 (mask defects) includes a defect considered to have adverse effect on the device, the mask is to be shipped after carrying out the defect correction for the place existing the defect.

However, when the cost for the defect correction is considered to have greater importance than the effect on the device (for example, when the defect size shown in FIG. 3 is large, and the cost for the defect correction exceeds an allowable level), the mask may be shipped without carrying out the defect correction. In this case, a circuit technique for reducing the influence of the mask defect on the device (for example, a redundancy circuit) may be used.

The inspection A2 is an inspection performed on a mask accepted by LSI factory. The inspection A2 is mainly aimed at detecting defect adhered on the mask during transportation of the mask.

Although the inspection A2 is performed on the patterns of the mask by using a mask defect inspection apparatus in some cases, in general, the inspection A2 is performed on patterns formed in a plane of a wafer. More specifically, the patterns are formed by repeating the lithography process (shots) by using the mask, and the defect detection is carried out for each of the patterns on the plane of the wafer.

The inspection A3 is aimed at detecting defect appeared with age by performing lithography process or depending on storage state of the mask in a course of using the mask in the LSI factory. Particularly, the defect appeared with age by lithography process is called growing defect (Haze defect), and is recently becoming a problem on mask management in the factory.

Although the inspection A3 is carried out for the mask by using mask defect inspection apparatus in some cases, in general, like the inspection A2, the pattern actually formed on the wafer is subjected to the defect inspection.

FIG. 8 is a cross-sectional view schematically showing an example of a device having a three-dimensional stack structure (three-dimensional stack device).

In each of the first to fourth layers L1 to L4, a first pattern P1 and second pattern P2 are formed.

The first pattern P1 and second pattern P2 differ from each other in at least one of pattern layout and pattern size.

Here, the first and second layers L1 and L2 are given as the lower layers, and third and fourth layers L3 and L4 are given as the upper layers.

FIG. 9 is a flowchart showing the manufacturing method of the three-dimensional stack device of FIG. 8.

[S1]

The same patterns in different layers of the three-dimensional stack device to be manufactured are extracted. Here, in the case of FIG. 8, the first patterns P1 and second patterns P2 are extracted. The extraction of the same patterns is carried out on the basis of, for example, design data of the three-dimensional stack device.

[S2]

The pattern in each of the layers L1 to L4 is formed by using lithography process.

At this time, the pattern forming of the lower layers L1 and L2 is performed by lithography process using a mask (high quality mask) having small influence of defect on the three-dimensional stack device in manufacturing the three-dimensional stack device. Here, the mask (high quality mask) having small influence of defect on the three-dimensional stack device in manufacturing the three-dimensional stack device is, for example, a mask capable of suppressing the increase of defect number in the three-dimensional stack device, a mask capable of suppressing the generation of defect having large size, or a mask capable of suppressing the deterioration of transcription property.

On the other hand, the pattern forming of the upper layers L3 and L4 is performed by lithography process using a mask (standard mask) within the specification permissible range, other than the high quality mask.

The high quality mask is not a mask formed by a particular mask process so that the defect influence can be reduced. The high quality mask is a mask formed by using the same mask process as the standard mask. Even when a plurality of masks are formed by the same mask process, a high quality mask, standard-quality mask, and poor-quality mask are formed due to the variations of the process or the like. That is, a plurality of masks to be used in lithography processes of a plurality of layers, identical with each other in the pattern, and ranked in the order of quality are obtained. Among the plurality of masks (a plurality of masks of the same mask group) formed by the same mask process, for example, a mask having the small defect number is used as the high quality mask. This point will be described further later.

It should be noted that when the high quality mask is used for both the pattern belonging to the lower layer and the pattern belonging to the upper layer, the frequency of use of the high quality mask becomes higher, and the pacing of deterioration of the high quality mask increases. Pattern belonging to the lower layer is more likely to have the defect, and the effect of improving the yield rate of the three-dimensional stack device is lowered. Accordingly, from the viewpoint of improving the yield rate of the three-dimensional stack device, in the present embodiment, the patterns belonging to the upper layers are formed by using the standard mask as described above.

Figure 10:
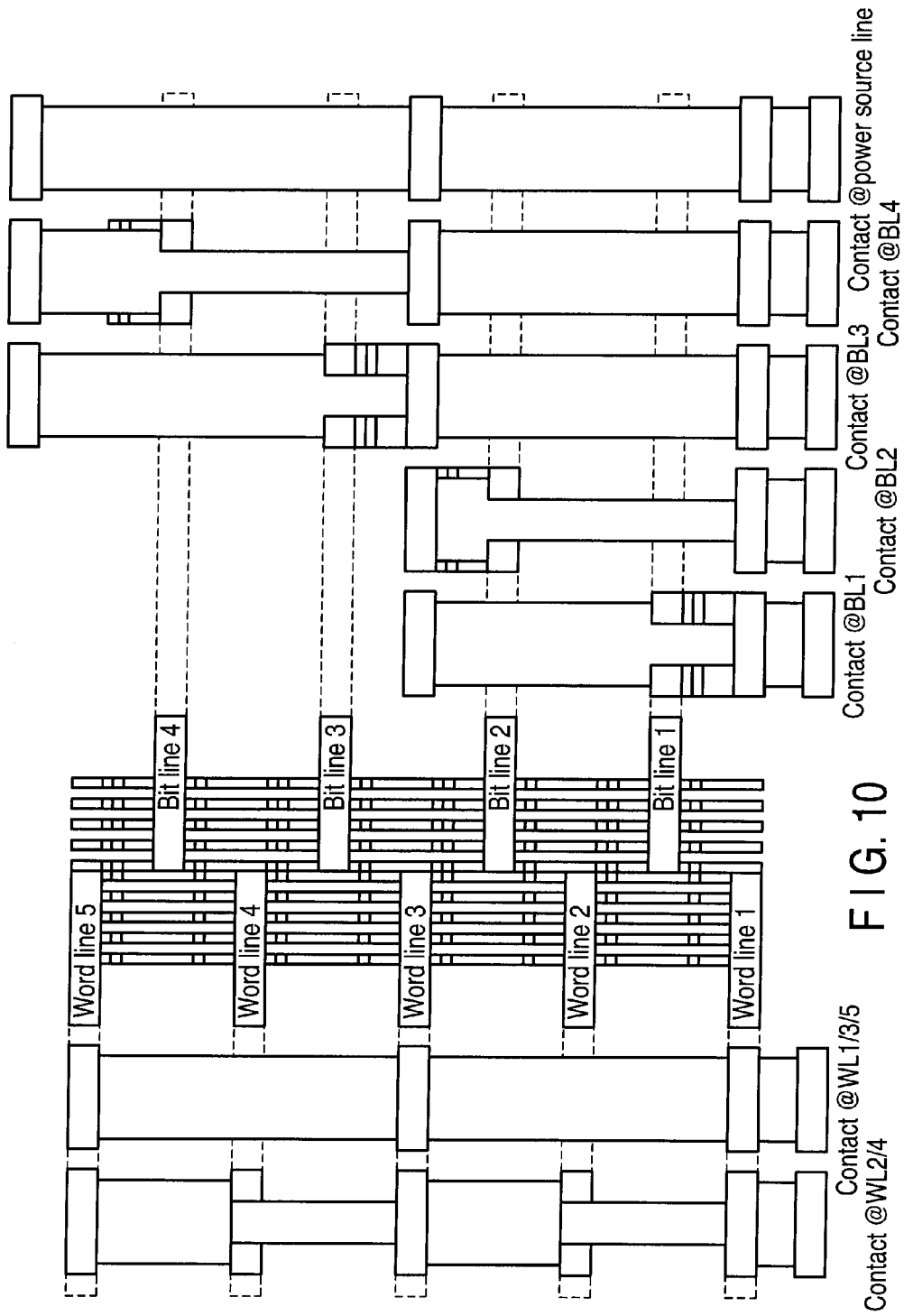
FIG. 10 is a view showing an example of a pattern layout of a three-dimensional stack memory device.

FIG. 10 is a view showing an example of a pattern layout of the three-dimensional stack memory device. In FIG. 10, word lines are formed in five layers, and bit lines are formed in four layers. Here, the first and second layers are given as the lower layers, and the layers higher than the second are given as the upper layers. The three-dimensional stack memory device is, for example, a nonvolatile memory device including a Cross Point Stack Structure such as a PCRAM, ReRAM, MRAM or the like.

In the case of FIG. 10, the word line WL1, word line WL3, and word line WL5 (numbers are serial numbers from the lower layer) each have exactly the same layout in terms of the circuit configuration. Likewise, the word line WL2, and word line WL4 each have exactly the same layout in terms of the circuit configuration.

Therefore, the word line WL1, word line WL3, and word line WL5 can be formed by a plurality of masks in the same mask group (first same mask group), the word line WL2 and word line WL4 can be formed by a plurality of masks in another same mask group (second same mask group).

When the word line WL1, word line WL3, and word line WL5 are formed by the plurality of masks in the first same mask group, the word line WL1 is in the lower layer, and hence the word line WL1 is formed by using the high quality mask. The word lines WL2 and WL3 are in the upper layer, and hence the word lines WL2 and WL3 are formed by using the standard mask.

Likewise, when the word line WL2 and word line WL4 are formed by the plurality of masks in the second same mask group, the word line WL2 is formed by using the high quality mask, and word line WL4 is formed by using the standard mask.

In addition, bit lines or contacts not shown in FIG. 10 may be formed by using the high quality mask for the lower layer and the standard mask for the upper layer as in the case of the world lines if each of the lower and higher layers has the completely same layout of the bit lines or contacts in terms of circuitry.

It should be noted that in FIG. 10, although the word lines are in the five layers, the word lines may be in more than five layers, for example, eight layers, and likewise, the bit lines are not limited to be in four layers.

As described above, when the same patterns corresponding to the same device circuit exist in the different layers, the increase of defect number in the three-dimensional stack device, the generation of defect having large size, or the deterioration of transcription property is suppressed, by performing the lithography process for forming the pattern belonging to the lower layer by using the high quality mask in the plurality of masks in the same mask group, and performing the lithography process for forming the pattern belonging to the upper layer by using the standard mask in the plurality of masks in the same mask group. As a result, the yield rate of the three-dimensional stack device is improved.

Next, a method of selecting the high quality mask and the standard mask from the plurality of masks in the same mask group will be described below.

Figure 11:
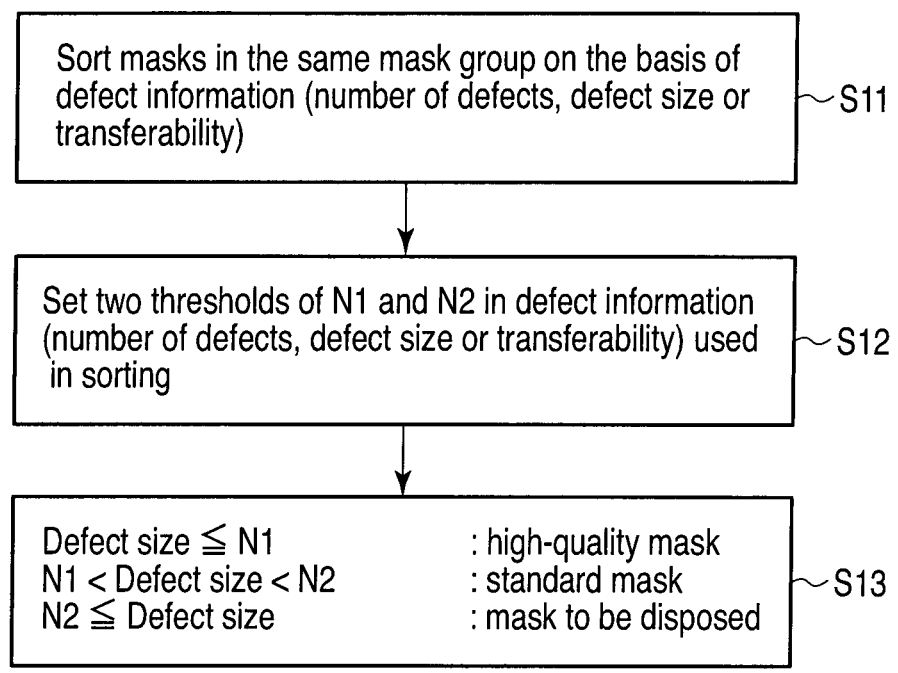
FIG. 11 is a flowchart showing a method of selecting a high quality mask and standard mask of the second embodiment.

FIG. 11 is a flowchart showing the method of selecting the high quality mask and the standard mask.

[S11]

On the basis of the result of the inspection A1, inspection A2, or inspection A3 described above (defect information), the plurality of masks in the same mask group are sorted.

Figure 13:
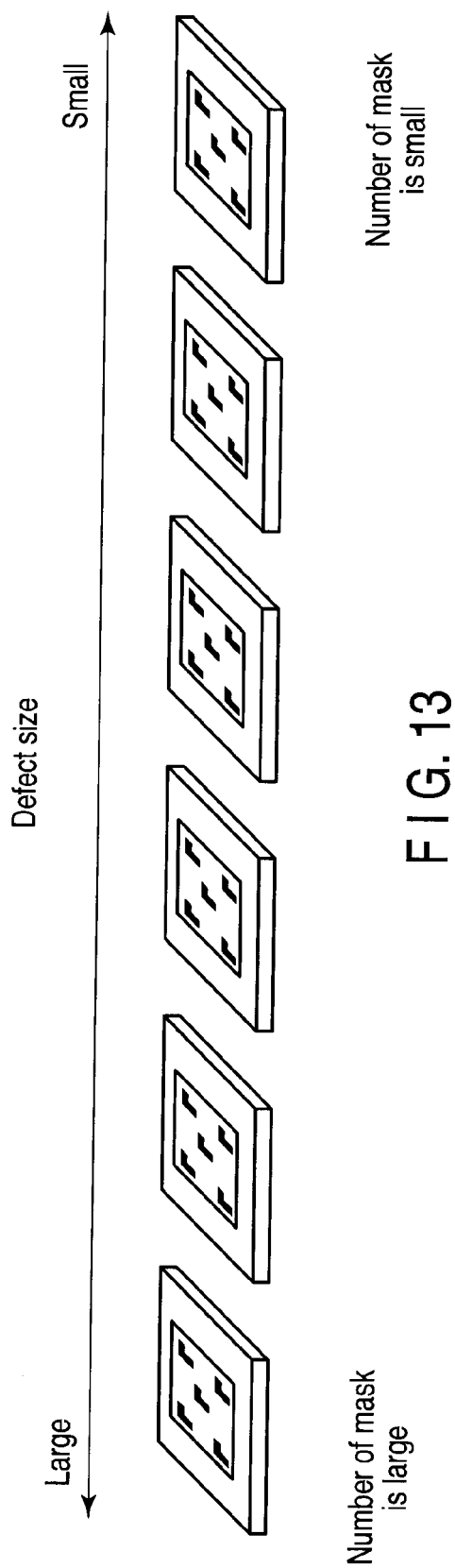
FIG. 13 is a view schematically showing a sorting method based on defect size.

As the examples of the sorting method (ranking of quality levels), a method (FIG. 12) based on the number of mask defects (defect number), a method (FIG. 13) based on the size of the mask defect (defect size) of the mask, and a method (FIG. 14) based on the defect transcription property of the mask pattern to the wafer (killer rate of a device due to the mask defect) are given.

In this way, the plurality of masks ranked according to the quality are obtained.

It should be noted that FIG. 12 shows the distribution having uniform number of masks (one) for simplicity, however, in fact, for example, the number of masks with sufficiently small defect numbers is generally smaller than the number of masks with standard defect numbers. The same applies to the case of defect size in FIG. 13 and the case of killer rate in FIG. 14. The defect size is the size of defect which is the largest defect in the plurality of defects.

As the another example of the sorting method, a method considering how much the three-dimensional stack device is influenced by the defect number, the defect size, or the killer rate is given, which does not carry out the sorting simply on the basis of the defect number, the defect size, or the killer rate.

The following is an example of it. A defect on an area of the mask corresponding to a lead wiring to be formed on the substrate has, a greater influence on the three-dimensional stack memory device, than a defect on an area of the mask corresponding to a memory cell array to be formed on the substrate.

Therefore, even the numbers are the same, the number of defects on the mask area corresponding to the lead wiring and the number of defects on the mask area corresponding to the memory cell array are weighted such that the number of defects on the mask area corresponding to the lead wiring is to be larger than the number of defects on the mask area corresponding to the memory cell array. The sorting is carried out on the basis of such a weighted number of defects.

In the case of the defect size, the weighting for the defect size is carried out such that the defect size on the mask area corresponding to the lead wiring is to be larger than the defect size on the mask area corresponding to the memory cell array, and the sorting is carried out on the basis of such a weighted defect size. In the case of the killer rate, the weighting for the killer rate is carried out such that the defect transcription property on the mask area corresponding to the lead wiring is to be worse than the defect transcription property on the area corresponding to the memory cell array, and the sorting is carried out on the basis of such a weighted killer rate.

[S12]

Figure 15:
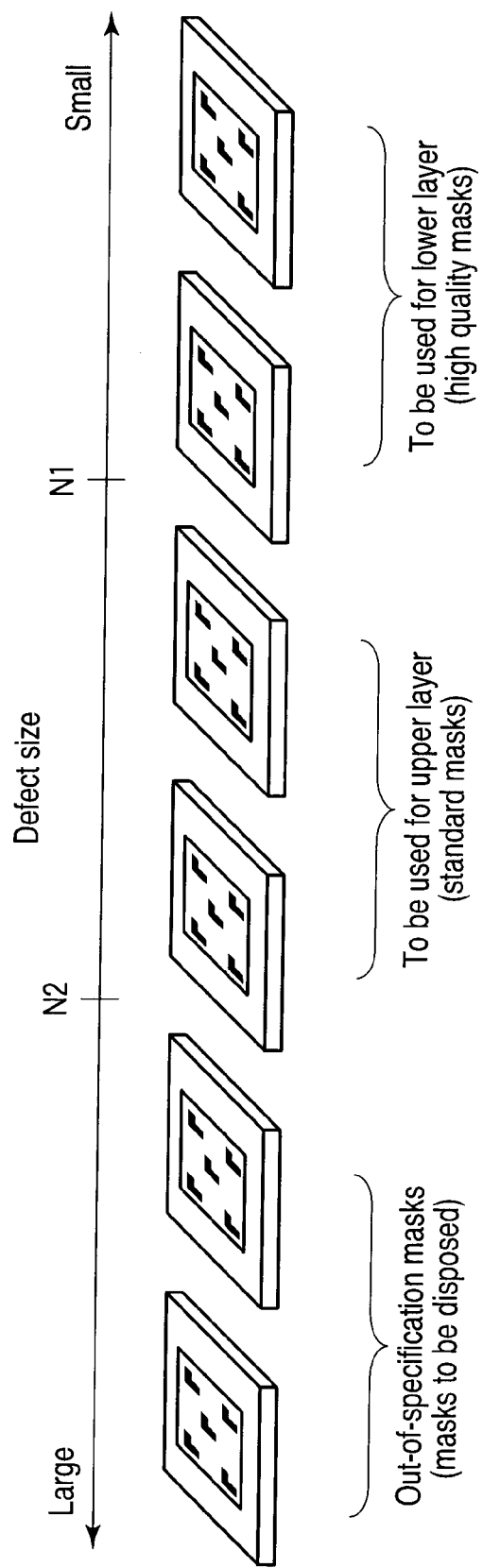
FIG. 15 is a view for explaining a method of setting a threshold.

Two threshold values (N1, N2) are set on the defect information (defect number, defect size or killer rate) used in the sorting. The specific explanation will be described below with reference to FIG. 15 when the defect information used in the sorting is the defect size.

The threshold N1 is a value equal to or smaller than the defect size allowed for a mask usable for forming the lower layer of the three-dimensional stack device. The threshold N2 is a value larger than the defect size allowed for the mask usable for forming the three-dimensional stack device (out-of-specification).

As shown in FIG. 3, as the defect size and the failure probability of the device circuit have the correspondent relationship, the mask having the defect size higher than a certain value (V1) cannot be used for the lithography of the lower layer. Accordingly, the value V1 can be used as the threshold N1. In the same manner, it is possible to set the threshold N2 in advance on the basis of the failure probability.

The two thresholds N1 and N2 are determined in the same manner when the defect information used in the sorting is the defect number and the killer defect.

[S13]

By determining the two thresholds N1 and N2, it is possible to classify the plurality of masks in the same mask group into three groups.

The masks belonging to a group satisfying "defect size≦N1" are the high quality masks having the certain level or higher to be used for forming the lower layers of the three-dimensional stack device.

The masks belonging to a group satisfying "N1<defect size<N2" are the standard masks to be used for forming the upper layers of the three-dimensional stack device.

The masks belonging to a group satisfying "N2≦defect size" are not used for forming the three-dimensional stack device (out-of-specification), and are subjected to, for example, disposal. Since masks belonging to the group satisfying "N2≦defect size" are not used, in the last result, the plurality of masks in the same mask group are classified into the two groups of the high quality masks and standard masks.

Here, although the two thresholds are set, three or more thresholds may be set. When three or more thresholds are set, the mask belonging to the group having the lower threshold value is used form forming the pattern belonging to the layer lying lower level, and number of the threshold value corresponding to the out-of-specification is one. In this case, in the last result, the plurality of masks in the same mask group are finally classified into three or more groups.

In the present embodiment, the mask to be used for forming the pattern belonging to the upper layer and the mask to be used for forming the pattern belonging to the lower layer are determined based on the defect information (defect number, defect size or killer rate). Instead, in the plurality of masks (having allowable range conforming with the specifications) in the same mask group, the mask having frequently used for the lithography process may be used for forming the pattern belonging to the higher layer, and the mask having less frequently used for the lithography process may be used for forming the pattern belonging to the lower layer.

Third Embodiment

The second embodiment describes the case of optical lithography process using the transparent mask as the original plate, but the present embodiment describes a case of imprint lithography process using a template as the original plate.

Figure 16:
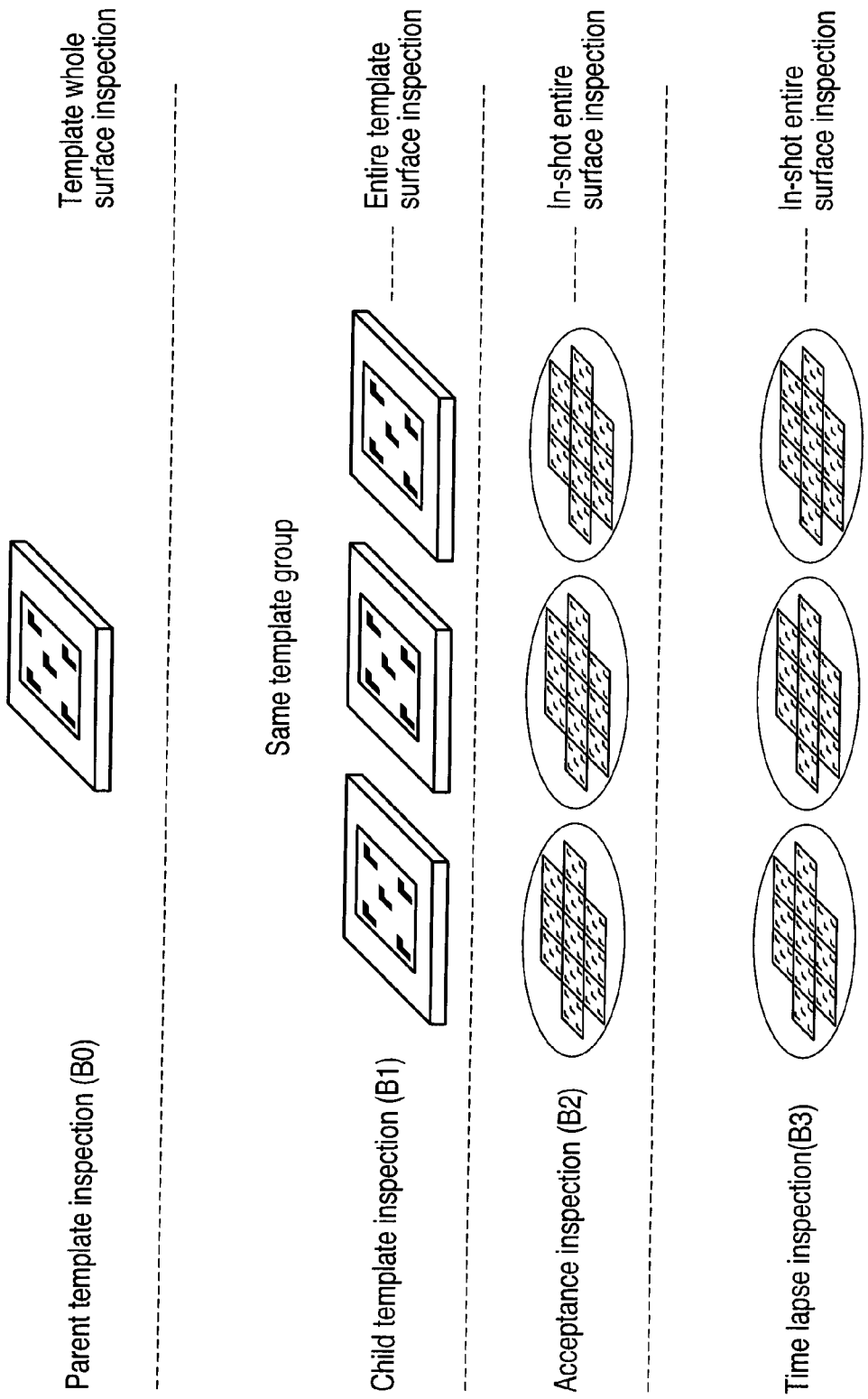
FIG. 16 is a view schematically showing an inspection flow of a template.

FIG. 16 is a view schematically showing an inspection flow of the template.

The inspection of the template includes an inspection of a parent template (B0), an inspection at the time of shipment of a child template (B1), an inspection at the time of acceptance of the template (B2), and time lapse inspection of the template (B3).

The inspection B0 is an inspection carried out to the parent template before being used to form the child template. The child template is formed by imprint lithography using the parent template. The parent template is formed by template manufacturer. The inspection B0 is mainly carried out by using a template defect inspection apparatus.

The defect of the parent template to be detected by the inspection B0 is, for example, a defect resulting from template process for forming the parent mask (process for forming a pattern on a substrate), a defect resulting from template material (material constituting a member of the parent template such as a template substrate or the like), or a defect resulting from cleaning process (cleaning of the parent template obtained through the template process).

When the defects detected by the inspection B0 (template defects) includes a defect considered to have adverse effect on the device, the parent template is to be shipped after carrying out the defect correction for the place existing the defect.

However, when the cost for the defect correction is considered to have greater importance than the effect on the device, the parent template may be shipped without carrying out the defect correction. In this case, a circuit technique for reducing the influence of the template defect on the device (for example, a redundancy circuit) may be used.

The inspection B1 is an inspection performed on the child template at the time of shipment. The inspection B1 is carried out by the template manufacturer. The inspection B1 is mainly carried out by using a template defect inspection apparatus.

The defect of child template detected by the inspection B1 is, for example, the defect resulting from the template process, the template material, or the cleaning process.

When the defects detected by the inspection B1 (template defects) includes a defect considered to have adverse effect on the device, the child template is to be shipped after carrying out the defect correction for the place existing the defect.

However, when the cost for the defect correction is considered to have greater importance than the effect on the device, the child template may be shipped without carrying out the defect correction. In this case, a circuit technique for reducing the influence of the template defect on the device (for example, redundancy circuit) may be used.

The inspection B2 is an inspection performed on a template accepted by LSI factory. The inspection B2 is mainly aimed at detecting defect adhered on the template during transportation of the template.

Although the inspection B2 is performed on the patterns of the template by using a template defect inspection apparatus in some cases, in general, the inspection B2 is performed on patterns formed in a plane of a wafer. More specifically, the patterns are formed by repeating the imprint lithography process (shots) by using the template, and the defect detection is carried out for each of the patterns on the plane of the wafer.

The inspection B3 is aimed at detecting defect appeared with age by performing imprint lithography process or depending on storage state of the template in a course of using the template in the LSI factory. Particularly, the defect appeared with age by lithography process is called growing defect (Haze defect), and is recently becoming a problem on mask management in the factory. Particularly, the increasing of defects with age is recently becoming a problem, which is caused by that the cured curable resin partially remains on the template at the time of releasing the template from the cured curable resin (at time of demolding) in the imprint lithography process. The defect resulting from the cured curable resin partially remains on the template is called a release defect.

Although the inspection B3 is carried out for the template by using template defect inspection apparatus in some cases, in general, like the inspection B2, the pattern actually formed on the wafer is subjected to the defect inspection.

Next, a manufacturing method of the three-dimensional stack device of the present embodiment will be described. Here, a description will be given by taking the three-dimensional stack device shown in FIG. 8 as an example.

Figure 17:
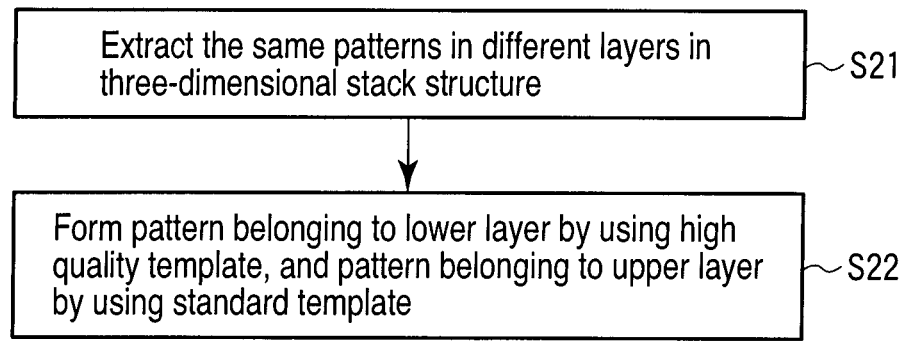
FIG. 17 is a flowchart showing a manufacturing method of a third embodiment.

FIG. 17 is a flowchart showing the manufacturing method of the three-dimensional stack device of the present embodiment.

[S21]

The same patterns existing respectively in different layers of the three-dimensional stack device to be manufactured are extracted. Here, the same patterns are patterns corresponding to the device circuit as described above, and are not alignment patterns or the like. In the case of FIG. 8, a first pattern P1 and a second pattern P2 are extracted. The extraction of the same patterns described above are carried out on the basis of, for example, design data of the three-dimensional stack device.

[S22]

The patterns in the layers L1 to L4 are formed by using the imprint lithography process.

At this time, the pattern forming of the lower layers L1 and L2 is performed by the imprint lithography process using a template (quality template) having small influence of the defect on the three-dimensional stack device in manufacturing the three-dimensional stack device.

Here, the template (high quality template) having small influence of defect on the three-dimensional stack device in manufacturing the three-dimensional stack device is, for example, a template capable of suppressing the increase of defect number in the three-dimensional stack device, a template capable of suppressing the generation of defect having large size, or a template capable of suppressing the deterioration of transcription property.

On the other hand, the pattern forming of the upper layers L3 and L4 is performed by imprint lithography process using a template (standard template) within the specification permissible range, other than the high quality template.

The high quality template is not a template formed by a particular imprint process so that the defect influence can be reduced. The high quality template is a template formed by using the same imprint process as the standard template. Even when a plurality of templates are formed by the same imprint process, a high quality template, standard-quality template, and poor-quality template are formed due to the variations of the process or the like. That is, a plurality of template to be used in imprint lithography processes of a plurality of layers, identical with each other in the pattern, and ranked in the order of quality are obtained. Among the plurality of templates (a plurality of templates of the same mask group) formed by the same mask process, for example, a template having the small defect number is used as the high quality template. This point will be described further later.

It should be noted that when the high quality template is used for both the pattern belonging to the lower layer and the pattern belonging to the upper layer, the frequency of use of the high quality template becomes higher, and the pacing of deterioration of the high quality template increases. Pattern belonging to the lower layer is more likely to have the defect, and the effect of improving the yield rate of the three-dimensional stack device is lowered. Accordingly, from the viewpoint of improving the yield rate of the three-dimensional stack device, in the present embodiment, the patterns belonging to the upper layers are formed by using the standard template as described above.

Further, when the three-dimensional stack memory device shown in FIG. 10 is manufactured by using the manufacturing method of the present embodiment, the word line WL1 is formed by using the high quality template in the first template group, and word lines WL3 and WL5 are formed by using the standard template in the first template group.

Likewise, the word line WL2 is formed by using the high quality template in the second template group, and word line WL4 is formed by using the standard template in the second template group.

As described above, when the same patterns (patterns same each other in at least one of the layout and the size) exist in the different layers, the increase of defect number in the three-dimensional stack device, the generation of defect having large size, or the deterioration of transcription property is suppressed, by performing the imprint lithography process for forming the pattern belonging to the lower layer by using the high quality template in the plurality of templates in the same template group, and performing the imprint lithography process for forming the pattern belonging to the upper layer by using the standard template in the plurality of templates in the same template group. As a result, the yield rate of the three-dimensional stack device is improved.

Next, a method of selecting the high quality template and the standard template from the plurality of templates in the same template group will be described below.

Figure 18:
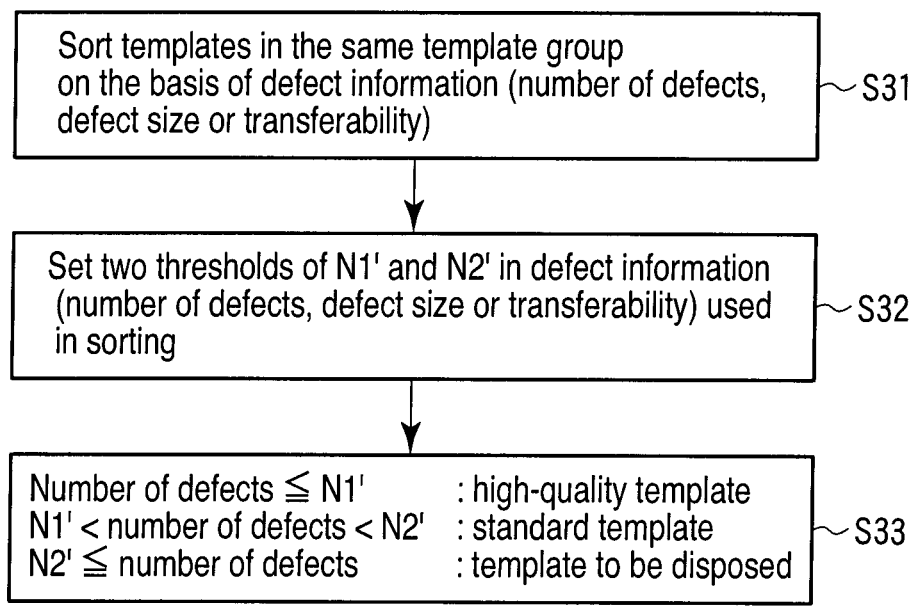
FIG. 18 is a flowchart showing a method of selecting a high quality template and standard template of the third embodiment.

FIG. 18 is a flowchart showing the method of selecting the high quality template and standard template.

[S31]

On the basis of the result of the inspection B1, inspection B2, or inspection B3 described above (defect information), the plurality of templates in the same template group are sorted.

In this way, the plurality of templates ranked according to the quality are obtained.

As the examples of sorting method (ranking of quality levels) a method based on the number of template defects (defect number), a method based on the size of the template defect (defect size) of the template, and a method based on the defect transcription property of the template pattern to the wafer (killer rate of a device due to the template defect) are given. The defect size is, for example, an average value of sizes of the plurality of defects, or the maximum value of sizes of the plurality of defects.

As the another example of the sorting method, a method considering how much the three-dimensional stack device is influenced by the defect number, the defect size, or the killer rate is given, which does not carry out the sorting simply on the basis of the defect number, the defect size, or the killer rate.

For example, since the defect on the lead wiring has a greater influence on the three-dimensional stack memory device than the defect on the area between the memory cells, even the numbers are the same, the defects are weighted such that the number of defects on the lead wiring is to be larger than the number of defects on the area between the memory cells. The sorting is carried out on the basis of such a weighted number of defects.

In the case of the defect size, the weighting for the defect size is carried out such that the defect size on the lead wiring is to be larger than the defect size on the area between the memory cells, and the sorting is carried out on the basis of such a weighted defect size. In the case of the killer rate, the weighting for the killer rate is carried out such that the defect transcription property on the lead wiring is to be worse than the defect transcription property on the area between the memory cells, and the sorting is carried out on the basis of such a weighted killer rate.

[S32]

Two thresholds (N1', N2') are set on the defect information (defect numbers, defect size or killer rate) used in the sorting. The specific explanation will be described below when the defect information used in the sorting is the defect number.

The threshold N1' is a value equal to or smaller than the defect number allowed for a template usable for forming the lower layer of the three-dimensional stack device. The threshold N2' is a value larger than the defect number allowed for the template usable for forming the three-dimensional stack device (out-of-specification). The two thresholds N1' and N2' are determined in the same manner when the defect information used in the sorting is the defect size and the killer rate.

[S33]

By determining the two thresholds N1' and N2', it is possible to classify the plurality of templates in the same template group into three groups.

The templates belonging to a group satisfying "defect number≦N1'" are the high quality templates having the certain level or higher to be used for forming the lower layers of the three-dimensional stack device.

The templates belonging to a group satisfying "N1'<defect number<N2'" are the standard masks to be used for forming the upper layers of the three-dimensional stack device.

The templates belonging to a group satisfying "N2'≦defect number" are not used for forming the three-dimensional stack device (out-of-specification), and are subjected to, for example, disposal. Since masks belonging to the group satisfying "N2' defect number" are not used, in the last result, the plurality of templates in the same mask group are classified into the two groups of the high quality templates and standard templates.

Here, although the two thresholds are set, three or more thresholds may be set. When three or more thresholds are set, the template belonging to the group having the lower threshold value is used for forming the pattern belonging to the layer lying lower level, and number of the threshold value corresponding to the out-of-specification is one. In this case, in fine, the plurality of templates in the same mask group are classified into three or more groups.

In the present embodiment, the template to be used for forming the pattern belonging to the upper layer and the template to be used for forming the pattern belonging to the lower layer are determined based on the defect information (defect number, defect size or killer rate). Instead, in the plurality of templates (having allowable range conforming with the specifications) in the same template group, the template having frequently used for the imprint lithography process may be used for forming the pattern belonging to the higher layer, and the template having less frequently used for the imprint lithography process may be used for forming the pattern belonging to the lower layer.

Although in the second embodiment, the case of the optical lithography process (transmission-type mask) is described, and in the third embodiment, the case of the imprint lithography process (template) is described, the methods of the embodiments can also be applied to other advanced lithography techniques, for example, the EUV lithography process (reflection-type exposure mask).

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. An imprint lithography method for manufacturing a three-dimensional stacked semiconductor device comprising a plurality of device circuit layers stacked on and above a substrate, the method comprising:
   ranking each of a plurality of templates according to a quality based on defect, defect transcription property to the substrate, or the number of previous imprints for each template, wherein each of the plurality of templates includes a pattern corresponding to a device circuit of the plurality of layers;
   forming a lower layer of the plurality layers using a first template selected from the plurality of templates, wherein said quality for the first template is equal to or higher than a certain level; and forming a higher layer of the plurality of layers located higher than the lower layer using a second template selected from the plurality of templates, wherein said quality for the second template is lower than the certain level.

2. The method according to claim 1, wherein the quality based on defect is a quality based on defect size.

3. The method according to claim 2,
   wherein the defect size is related to a failure probability of the device circuit, and
   wherein the first template has a defect size corresponding to a failure probability not higher than a predetermined value.

4. The method according to claim 2, wherein the defect size is a maximum size of defects.

5. The method according to claim 2, wherein the defect size is weighted based on its influence on the three-dimensional stacked device.

6. The method according to claim 1, wherein the quality based on defect is a quality based on defect number.

7. The method according to claim 6, wherein the number is weighted based on its influence on the three-dimensional stacked device.

8. The method according to claim 1, wherein the defect transcription property is weighted based on its influence on the three-dimensional stacked device.

9. The method according to claim 1, further comprising: forming a layer of the plurality layers located higher than the lower layer and lower than the higher layer using a third template selected from the plurality of templates, wherein said quality for the third template is higher than the quality of the second template and lower than the quality of the first template.

10. The method according to claim 1, wherein the device circuit comprises a plurality of memory cells arranged in a two-dimensional array.

11. The method according to claim 1, wherein the three-dimensional stacked device is PCRAM (Phase Change Memory), ReRAM (Resistance Random Access Memory), or MRAM (Magnetoresistive Random Access Memory).

12. The method according to claim 1, wherein the plurality of layers include line-and-space patterns.

13. The method according to claim 1, wherein the plurality of layers include word lines, bit lines, or contacts.

14. The method according to claim 1, wherein the quality based on defect includes a release defect.

15. The method according to claim 1, wherein the defect is caused by template processing, the material of the template, or cleaning the template.

16. The method according to claim 1, wherein the plurality of templates are formed by the same process.

* * * * *

UNITED STATES PATENT AND TRADEMARK OFFICE
CERTIFICATE OF CORRECTION

PATENT NO. : 8,480,934 B2
APPLICATION NO. : 12/958994
DATED : July 9, 2013
INVENTOR(S) : Hashimoto Page 1 of 1

It is certified that error appears in the above-identified patent and that said Letters Patent is hereby corrected as shown below:

In the Claims

Claim 1, column 13, line 35, change "plurality layers" to --plurality of layers--.

Claim 9, column 14, line 20, change "plurality layers" to --plurality of layers--.

Signed and Sealed this
Twenty-fourth Day of September, 2013

Teresa Stanek Rea
*Deputy Director of the United States Patent and Trademark Office*